US008152553B2

(12) United States Patent
Taguchi et al.

(10) Patent No.: US 8,152,553 B2
(45) Date of Patent: Apr. 10, 2012

(54) SOCKET CONTACT AND PGA IC SOCKET

(75) Inventors: Hidenori Taguchi, Tokyo (JP); Shinichi Hashimoto, Kanagawa (JP)

(73) Assignee: Tyco Electronics Japan G.K., Kanagawa-Ken (JP)

( * ) Notice: Subject to any disclaimer, the term of this patent is extended or adjusted under 35 U.S.C. 154(b) by 85 days.

(21) Appl. No.: 12/389,547

(22) Filed: Feb. 20, 2009

(65) Prior Publication Data
US 2009/0215291 A1   Aug. 27, 2009

(30) Foreign Application Priority Data

Feb. 21, 2008   (JP) ................................. 2008-040181

(51) Int. Cl.
H01R 4/50   (2006.01)
(52) U.S. Cl. ........................................ 439/342; 439/259
(58) Field of Classification Search .................. 439/342, 439/259, 265
See application file for complete search history.

(56) References Cited

U.S. PATENT DOCUMENTS

| 4,498,725 | A | 2/1985 | Bright et al. | |
|---|---|---|---|---|
| 5,518,426 | A | 5/1996 | Plainer | |
| 5,797,774 | A | 8/1998 | Kaneko | |
| 5,860,838 | A | 1/1999 | Kaneko | |
| 7,517,240 | B2 * | 4/2009 | Ma .............................. | 439/342 |
| 2003/0186576 | A1 * | 10/2003 | Lin ............................. | 439/342 |
| 2004/0009694 | A1 * | 1/2004 | Lai .............................. | 439/342 |
| 2007/0026719 | A1 * | 2/2007 | Liao ............................ | 439/342 |

FOREIGN PATENT DOCUMENTS

| JP | 58-150281 | | 9/1983 |
|---|---|---|---|
| JP | 60-109273 | U | 7/1985 |
| JP | 2-064184 | U | 5/1990 |
| JP | 2001-43940 | A | 2/2001 |
| JP | 3088738 | U | 7/2002 |
| JP | 2005-209617 | A | 8/2005 |

OTHER PUBLICATIONS

JP Office Action dated Jan. 12, 2010 for corresponding Japanese Patent Application No. 2008-040181, 2 pages.
3 Page Office Action dated May 25, 2010, issued by the Japan Patent Office for Japanese Patent Application No. 2008-040181.

* cited by examiner

Primary Examiner — Hien Vu
(74) Attorney, Agent, or Firm — Barley Snyder

(57) ABSTRACT

A socket contact that makes contact with a lead pin is provided on a mating electronic component, wherein this socket contact comprises a retention section that is press-fit in a contact cavity provided in a housing, a base section that extends downward from this retention section, and a pair of resilient contact pieces that extend from either side edge of this base section in mutually facing directions. The paired resilient contact pieces respectively comprise end sections that extend backward from the side edges of the base section, and lead pin contact sections that extend upward and forward at an inclination from the rear ends of the base section and that are also formed with an inclination so as to approach each other toward the tip ends thereof, and after the lead pin is inserted into the contact cavity toward the rear ends of the base end parts, the lead pin moves forward so as to contact the lead pin contact section in a position to the rear side of the retention section.

28 Claims, 13 Drawing Sheets

F I G. 3
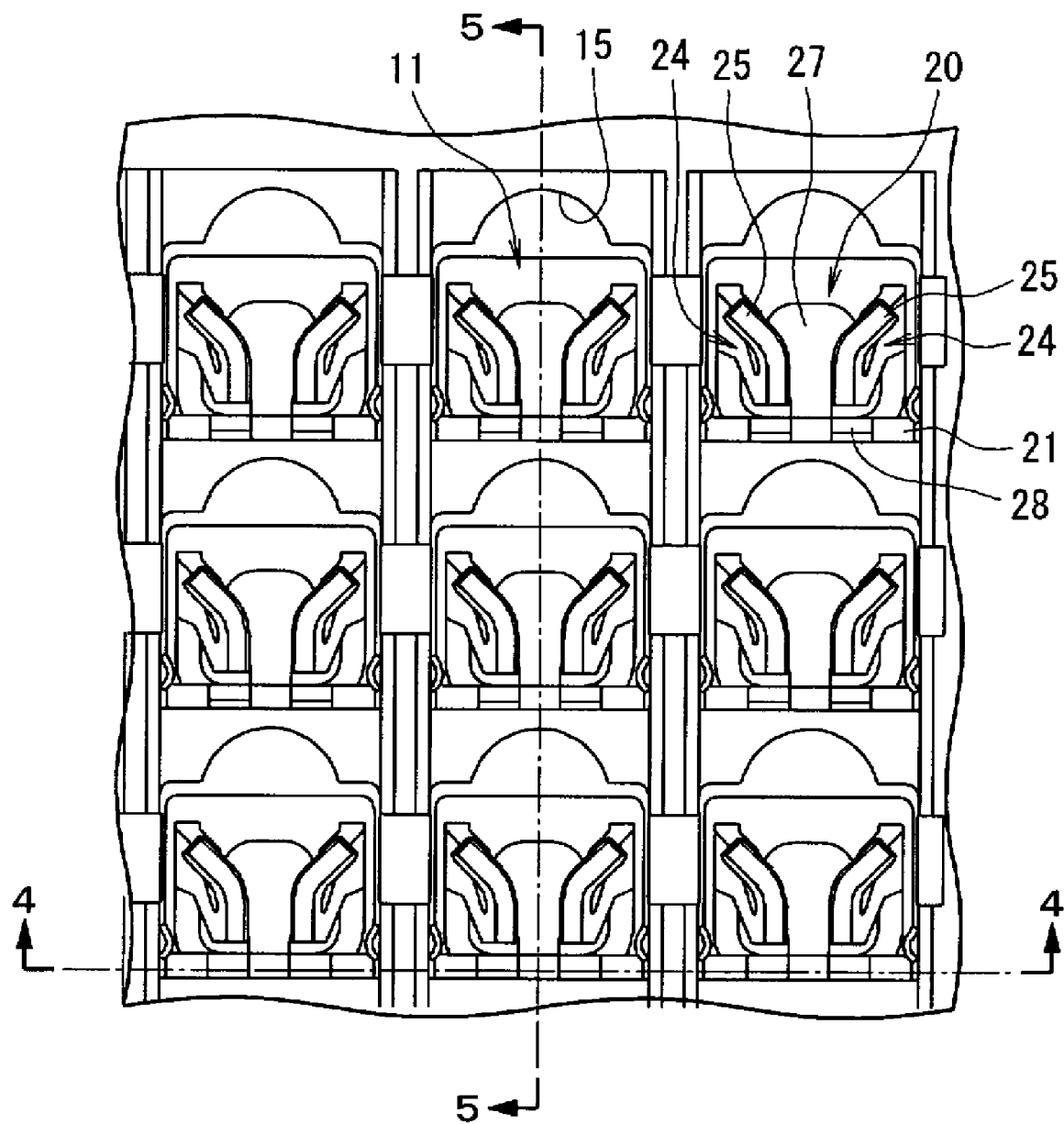

FIG. 8A
FIG. 8B
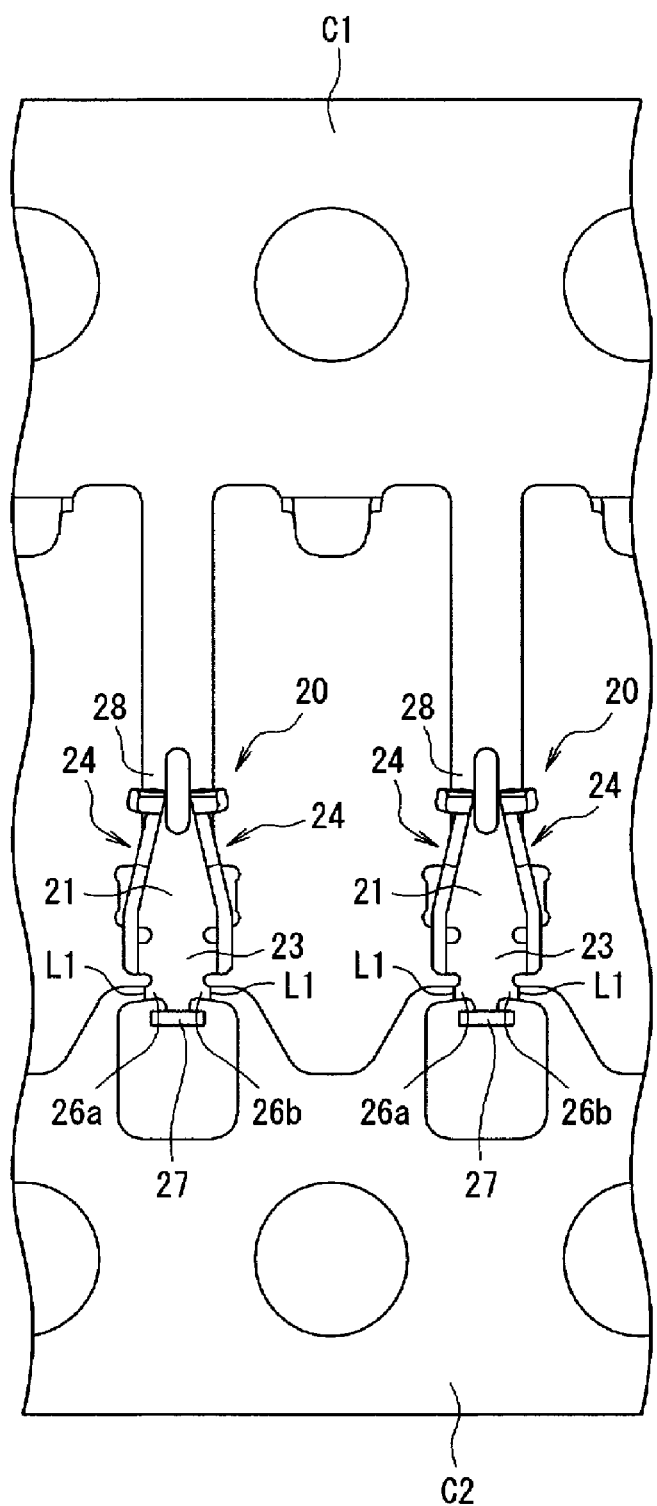
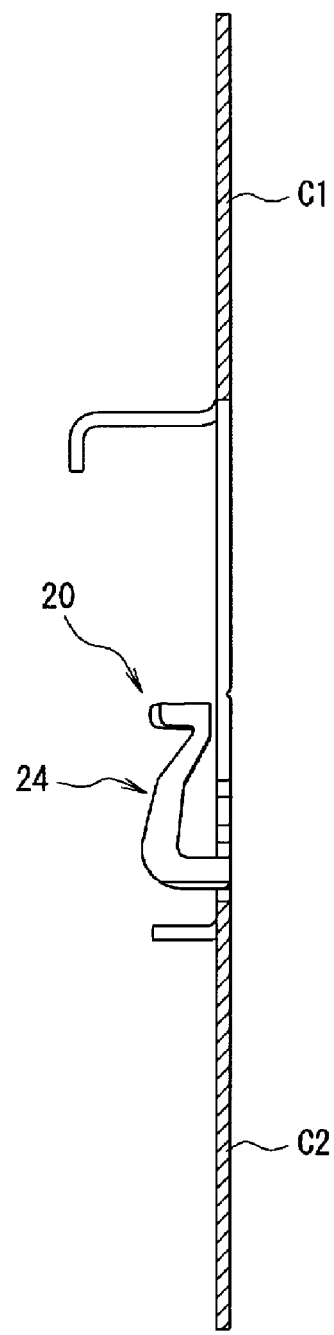

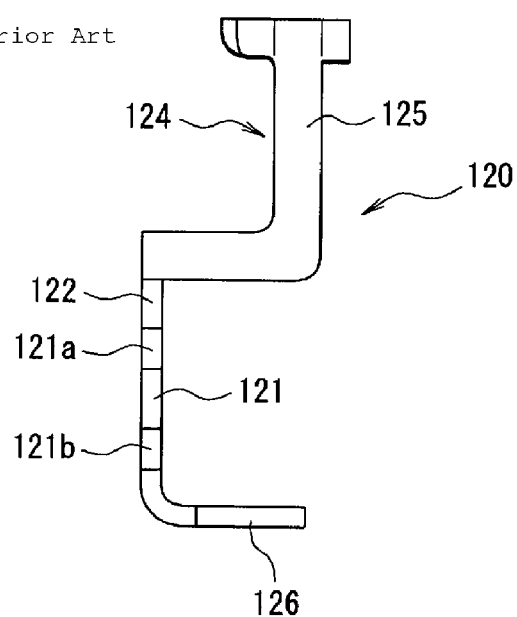
*F I G. 12 A*
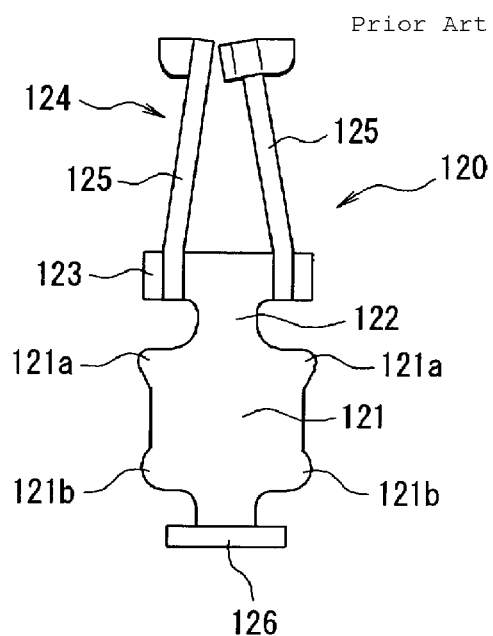
*F I G. 12 B*
*F I G. 13*
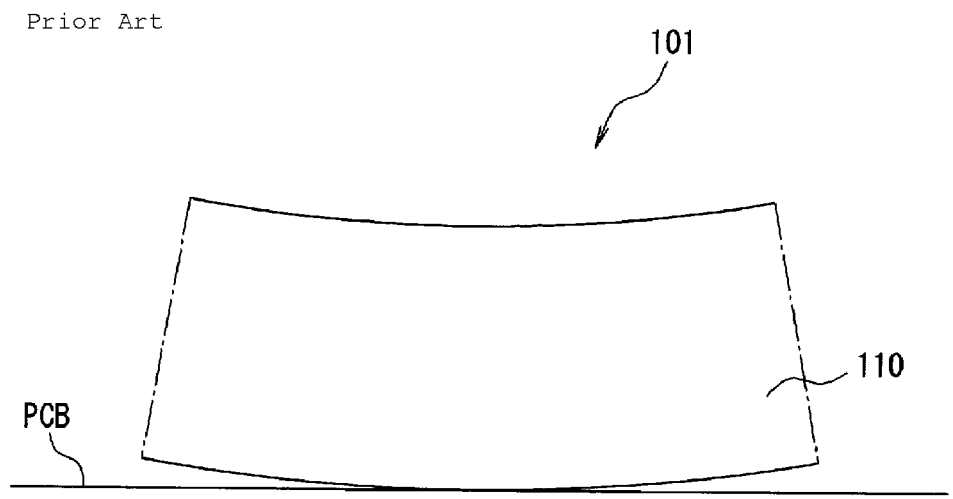

SOCKET CONTACT AND PGA IC SOCKET

CROSS-REFERENCE TO RELATED APPLICATIONS

This application claims the benefit of the filing date under 35 U.S.C. §119(a)-(d) of Japanese Patent Application No. 2008-040181, filed Feb. 21, 2008.

FIELD OF THE INVENTION

The present invention relates to a socket contact and to a pin grid array (PGA) integrated circuit (IC) socket, the socket contact used in the PGA IC socket to which a PGA IC, having numerous lead pins, is attached.

BACKGROUND

A socket, which is illustrated in FIGS. 11A through 12B (see JP2005-209617A), for example, is well known as a pin grid array (PGA) integrated circuit (IC) socket. FIGS. 11A and 11B show the conventional PGA IC socket; FIG. 11A is a sectional view of a PGA IC socket before the slide cover is moved, and FIG. 11B is a sectional view of the PGA IC socket after the slide cover is moved. FIGS. 12A and 12B show the socket contact; FIG. 12A is a left side view, and FIG. 12B is a front view.

The PGA IC socket (hereinafter referred to simply as "socket") 101, shown in FIGS. 11A and 11B, includes numerous socket contacts 120 that respectively contact numerous lead pins 151 of an IC package 150, a thin plate-form housing 110 in which contact cavities 111 that respectively accommodate the socket contacts 120 are arranged in a two-dimensional array, and a slide cover 130 which is provided on the upper portion of the housing 110 so as to be movable in a forward-backward direction (left-right direction in FIG. 11A).

As is shown in FIGS. 11A through 12B, each of the socket contacts 120 include a substantially rectangular plate-form retention section 121 that is press-fit into one of the contact cavities 111 of the housing 110, an resilient contact part 124 that extends from the upper end of the retention section 121, and a foot 126 that is provided at the lower end of the retention section 121. Upper engaging projections 121a and lower engaging projections 121b, which are press-fit into the corresponding contact cavity 111, are provided at both edge portions of the retention section 121 as shown in FIGS. 12A and 12B. The retention section 121 is press-fit into the contact cavity 111 such that the rear surface side (the back surface side with respect to the plane of page in FIG. 12B and the left surface side in FIG. 11A) of the retention section 121 follows along the side wall surface 111a that is on the rear side (left side in FIG. 11A) out of the side wall surfaces that partition the contact cavity 111 as shown in FIGS. 11A and 11B. Furthermore, the resilient contact part 124 includes a substantially rectangular plate-form base section 123 that extends in the direction of width of the retention section 121 (in the left-right direction in FIG. 12B and in a direction orthogonal to the plane of page in FIG. 11A) from the upper end edge of the retention section 121 via a narrowed part 122, and a pair of resilient contact pieces 125 that first extend forward (toward the viewer with respect to the plane of page in FIG. 12B and rightward in FIG. 11A) from either end of the base section 123 and then extend upward. The paired resilient contact pieces 125 are inclined in such a way to approach each other toward the tip ends thereof, and a lead pin 151 provided on the IC package 150 contacts between these resilient contact pieces 125. Moreover, the foot 126 extends forward from the lower end of the retention section 121, and a solder ball 127 is formed on the undersurface of the foot 126.

In cases where the IC package 150 is attached to the socket 101 shown in FIGS. 11A and 11B, the lead pins 151 are first respectively inserted into the contact cavities 111 by passing through receiving passageways 131 formed in the slide cover 130. Next, when the slide cover 130 is caused to move forward (in the arrow direction in FIG. 11A) by operating a lever or the like (not shown in the figures), a state is created in which the lead pins 151 are respectively held between the paired resilient contact pieces 125 of the socket contacts 120 as shown in FIG. 11B, thus making contact with these resilient contact pieces 125. As a result, the lead pins 151 and the corresponding solder balls (a circuit board connected to the solder balls) 127 are electrically connected. Here, the length L from the tip end of each lead pin 151 to the corresponding resilient contact pieces 125 contacted by the lead pin 151 is called an effective mating length.

In addition, the socket shown in FIGS. 14 and 15 (see JP2001-43940A), for instance, has also been known as another example of a conventional PGA IC socket. FIG. 14 is an explanatory diagram showing the relationship between a socket contact and a lead pin inside the housing in another example of a conventional PGA IC socket. FIG. 15 is a perspective view of a socket contact used in the PGA IC socket shown in FIG. 14.

The PGA IC socket (hereinafter referred to simply as "socket") 201 shown in FIG. 14 includes numerous socket contacts 220 that respectively contact numerous lead pins 251 of an IC package (not shown in the figures), a housing 210 in which contact cavities 211 that respectively accommodate the socket contacts 220 are arranged in a two-dimensional array, and a slide cover 230 which is provided on the upper portion of the housing 210 so as to be movable in the forward direction (direction of arrow F in FIG. 14) and in the backward direction (direction of arrow B in FIG. 14).

As is shown in FIGS. 14 and 15, each of the socket contacts 220 includes a substantially rectangular plate-form base section 221 that is press-fit in the bottom wall 212 of one of the contact cavities 211 of the housing 210, a substantially rectangular plate-form supporting section 222 that extends upward from the upper edge of the base section 221 and that has a smaller width than the base section 221, and a pair of resilient contact pieces 223 that extend from either side edge at the lower end of the supporting section 222. The base section 221 is press-fit in the bottom wall 212 of the corresponding contact cavity 211 such that the front surface side of the supporting section 222 follows along the side wall surface 211a that is on the front side out of the side wall surfaces which partition the contact cavity 211. A solder ball 228 is formed at the lower end of the base section 221. Furthermore, the resilient contact pieces 223 respectively include holding sections 224 that extend backward from the side edges at the lower end of the supporting section 222, introduction sections 225 that are provided at the tip ends of the holding sections 224, and pressing sections 226 that extend from the introduction sections 225 toward the supporting section 222; each of the resilient contact pieces 223 is formed substantially in the shape of the letter U. Legs 227 that slide over the bottom wall 212 when the resilient contact pieces 223 move are respectively provided at the lower ends of the introduction sections 225.

In cases where an IC package is attached to the socket 201 shown in FIG. 14, the lead pins 251 are first respectively inserted into the contact cavities 211 by passing through receiving passageways 231 formed in the slide cover 230. In this case, the tip end of each lead pin 251 is positioned between the introduction sections 225 of the corresponding socket contact 220. Next, when the slide cover 230 is caused to move forward by operating a lever or the like (not shown in the figures), a state is created in which the lead pins 251 are held between the paired pressing sections 226 of the corresponding socket contacts 220, thus making contact with the resilient contact pieces 223. As a result, the lead pins 251 and the corresponding solder balls (a circuit board connected to the solder balls) 228 are electrically connected.

However, in these sockets 101 and 201, there are cases in which the sockets 101 and 201 become warped in a concave shape as shown in FIG. 13 (only the socket 101 is shown in FIG. 13). In a case in which the socket 101 shown in FIGS. 11A and 11B is warped in a concave shape, for example, if the effective mating length L is short, the lead pins 151 provided on the IC package 150 do not contact the socket contacts 120 in some instances. For this reason, it is desirable to set the effective mating length L long in the sockets 101 and 201.

Meanwhile, with the sockets 101 and 201, as a result of electronic devices becoming higher in performance and smaller in size, there has been a demand for the socket contacts 120 and 220 to be arranged with a higher density and for the sockets 101 and 201 themselves to become lower in height.

Here, in the case of the socket 101 shown in FIGS. 11A and 11B, when the lead pins 151 are respectively inserted into the contact cavities 111 by passing through the receiving passageways 131 formed in the slide cover 130, these lead pins 151 are positioned directly above the retention section 121 of the corresponding socket contacts 120 attached to the housing 110. Therefore, if an attempt is made to reduce the height of the socket 101 while keeping the effective mating length L long, there is a danger of the tip ends of the lead pins 151 and the upper ends of the retention section 121 contacting each other. Thus, in the case of the socket 101 shown in FIGS. 11A and 11B, there is a limit to the height reduction.

In the case of the socket 101 shown in FIGS. 11A and 11B, furthermore, the resilient contact pieces 125 with which the lead pins 151 make contact respectively extend from both ends of the base section 123 that respectively extend in the direction of width of the retention section 121 from the upper end edges of the retention section 121 via the narrowed parts 122. Therefore, there is a drawback in that the spring length of the resilient contact pieces 125 is short compared to the case of the resilient contact pieces 125 respectively extending from the lower portions of the retention section 121.

Moreover, in the case of the socket 101 shown in FIGS. 11A and 11B, the retention section 121 are press-fit toward the bottom of the contact cavities 111 that pass through the housing 110 in the vertical direction as shown in FIG. 11A. When the retention section 121 of the socket contacts 120 are thus press-fit toward the bottom of the contact cavities 111, the lower side of the housing 110 is deformed, so that the lower side of the housing 110 becomes warped in a concave shape (as shown in FIG. 13) with respect to a printed circuit board (PCB) on which the socket 101 is mounted.

Meanwhile, in the case of the socket 201 shown in FIG. 14, when the lead pins 251 are respectively inserted into the contact cavities 211 by passing through the receiving passageways 231 formed in the slide cover 230, the tip ends of the lead pins 251 are positioned between the introduction sections 225 of the corresponding socket contacts 220, and are not positioned directly above the base sections 221. Furthermore, even in cases where the slide cover 230 moves forward to create a state in which the lead pins 251 are held between the paired pressing sections 226 of the corresponding socket contacts 220, the tip ends of the lead pins 251 are not positioned directly above the base section 221. Accordingly, even if an attempt is made to reduce the height of the IC socket 201 while keeping the effective mating length long, there is no risk of the lead pins 251 and the upper ends of the bottom wall 212 contacting each other, so that the height reduction of the socket 201 can be achieved.

However, even in the socket 201 shown in FIG. 14, because the resilient contact pieces 223 respectively extend from the side edges at the lower ends of the supporting section 222, i.e., the upper edges of the base section 221, there is a drawback in that the spring length of the resilient contact pieces 223 is short compared to the case of the resilient contact pieces 223 extending from the lower portions of the base section 221.

In addition, in the case of the socket 201 shown in FIG. 14, the base sections 221 are respectively press-fit in the bottom walls 212 of the contact cavities 211. Therefore, in the case of the socket 201 as well, when the base section 221 are respectively press-fit in the bottom walls 212, the lower side of the housing 210 is deformed, creating a problem in that the lower side of the housing 210 becomes warped in a concave shape with respect to the circuit board (not shown in the figures) on which the socket 201 is mounted.

SUMMARY

Accordingly, the present invention was devised to solve the problems described above. It is an object of the present invention to provide a socket contact used in a PGA IC socket to which a PGA IC having numerous lead pins is attached and a PGA IC socket, with this socket contact making it possible to achieve a height reduction without reducing the effective mating length, to be constructed with a large spring length, and to suppress warping of the housing to the maximum extent possible even if this socket contact is press-fit in the housing.

A socket contact according to the present invention is a socket contact that makes contact with a lead pin provided on a mating electronic component, wherein this socket contact comprises a retention section that is press-fit in a contact cavity provided in a housing, a base section that extends downward from this retention section, and a pair of resilient contact pieces that extend from either side edge of this base section in mutually facing directions. The paired resilient contact pieces respectively comprise end sections that extend backward from the side edges of the base section, and lead pin contact sections that extend upward and forward at an inclination from the rear ends of the base section and that are also formed with an inclination so as to approach each other toward the tip ends thereof, and after the lead pin is inserted into the contact cavity toward the rear ends of the base end parts, the lead pin moves forward so as to contact the lead pin contact section in a position to the rear side of the retention section.

BRIEF DESCRIPTION OF THE DRAWINGS

FIG. 3 is a plan view of the PGA IC socket in a state in which the slide cover is removed;

FIGS. 8A and 8B are the diagram showing a state in which bending work is performed from the stamped state of the metal plate shown in FIG. 7, with FIG. 8A being a front view corresponding to FIG. 6B, and FIG. 8B being a right side view corresponding to FIG. 6C;

FIGS. 12A and 12B show a socket contact, with FIG. 12A being a left side view, and FIG. 12B being a front view;

FIG. 13 is a schematic diagram showing an example in which the lower side of the housing in the PGA IC socket is warped in a concave shape with respect to a circuit board;

DETAILED DESCRIPTION OF THE EMBODIMENT(S)

Figure 1:
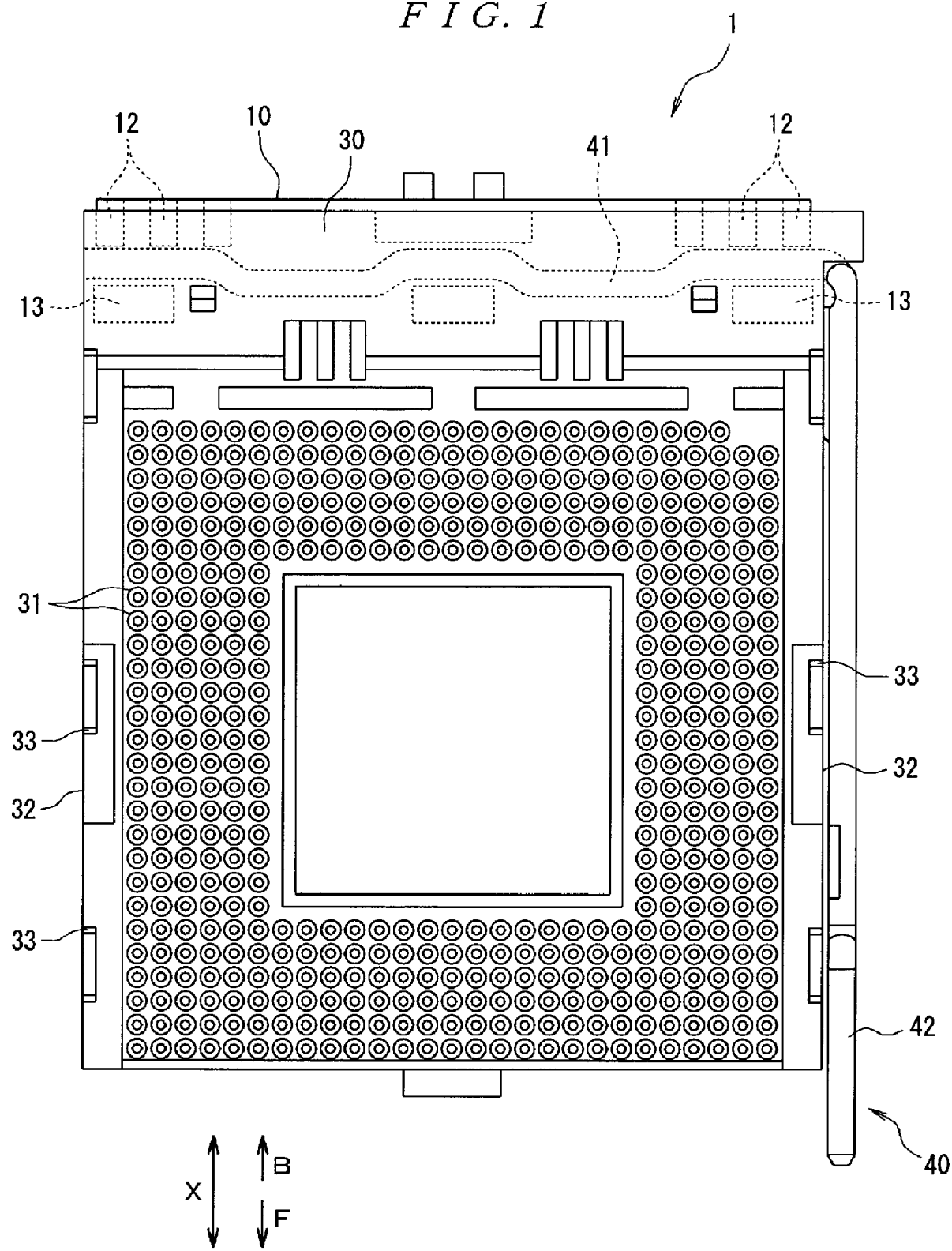
FIG. 1 is a plan view of an embodiment of the PGA IC socket of the present invention.
Figure 2:
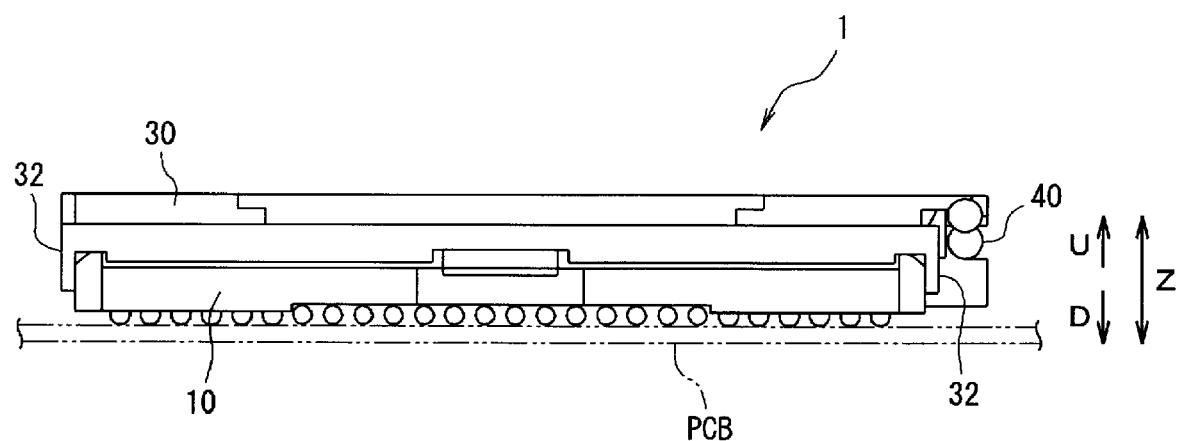
FIG. 2 is a front view of the PGA IC socket shown in FIG. 1.
Figure 4:
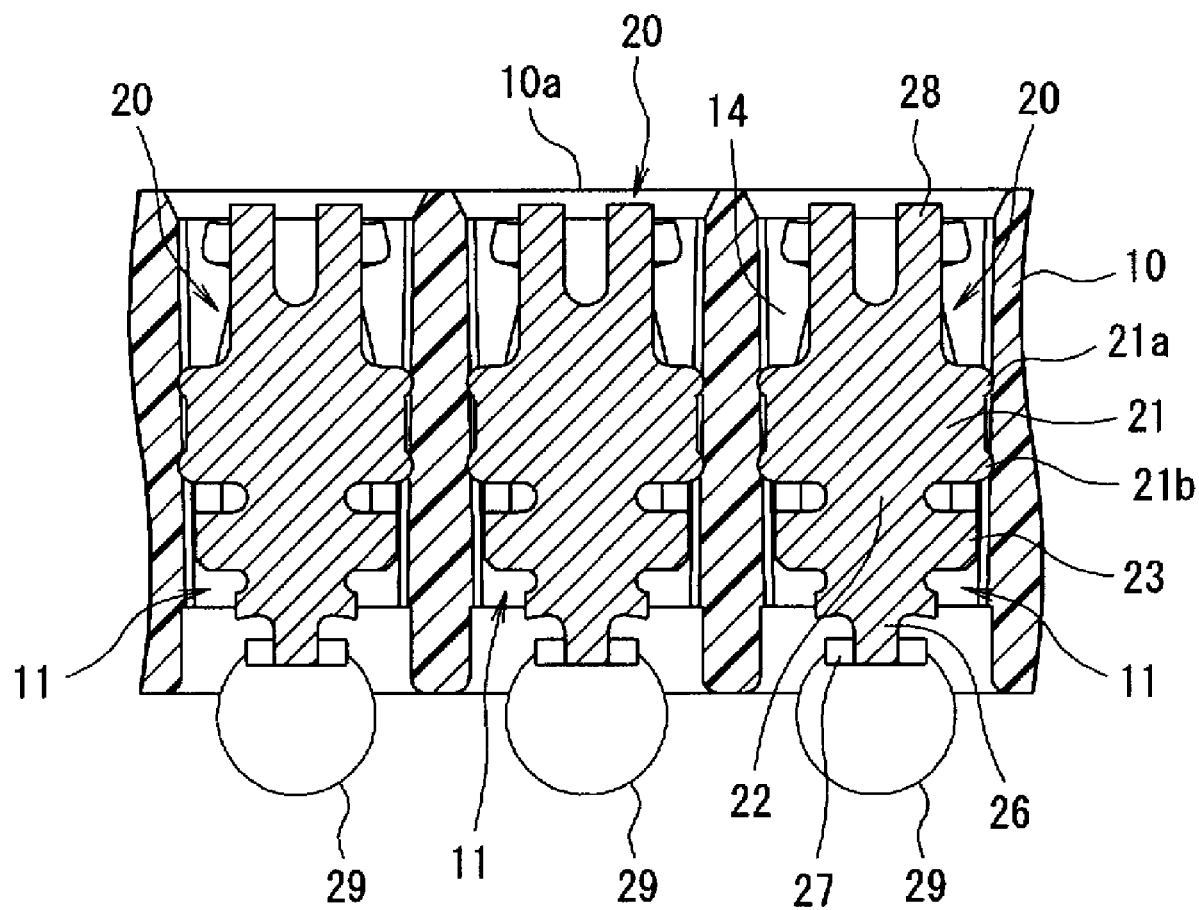
FIG. 4 is a sectional view along line 4-4 in FIG. 3.
Figure 5A:
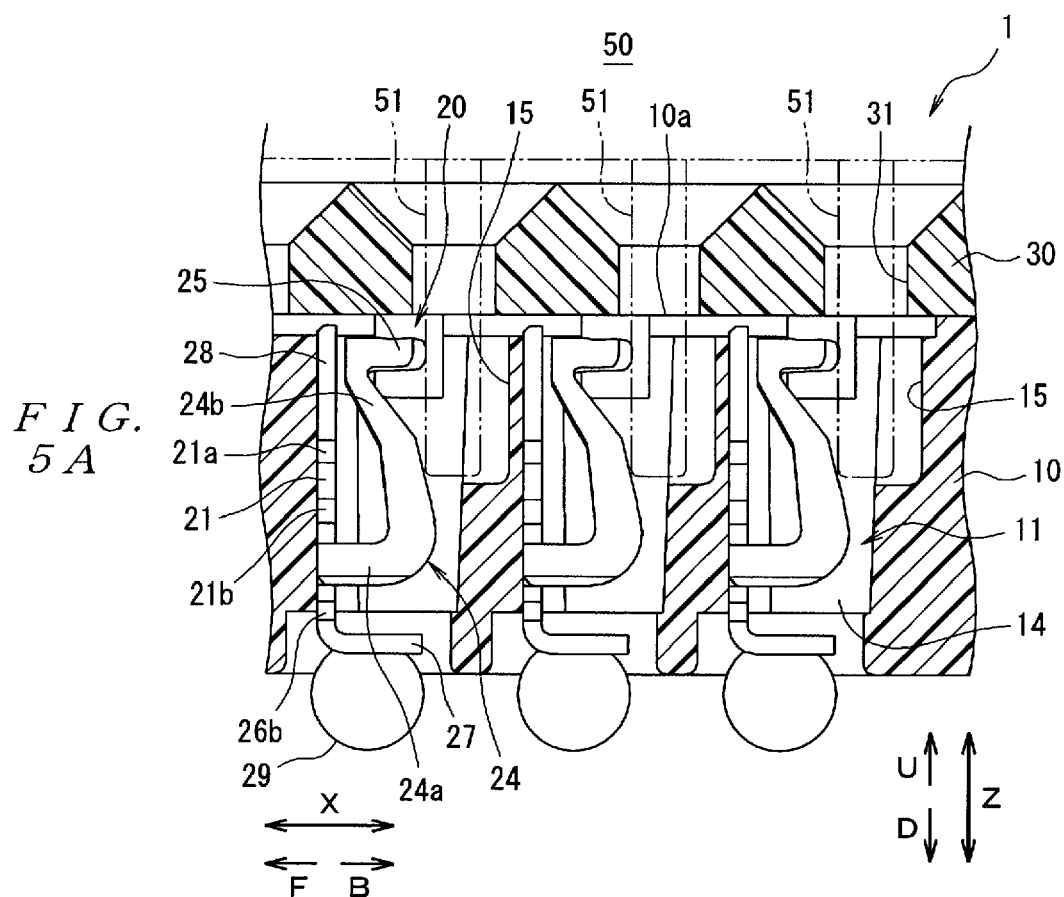
FIGS. 5A and 5B are the sectional view of the PGA IC socket cut along line 5-5 in FIG. 3, with FIG. 5A showing a state in which the slide cover is located in the initial position, and FIG. 5B showing a state in which the slide cover is located in the final position.
Figure 5B:
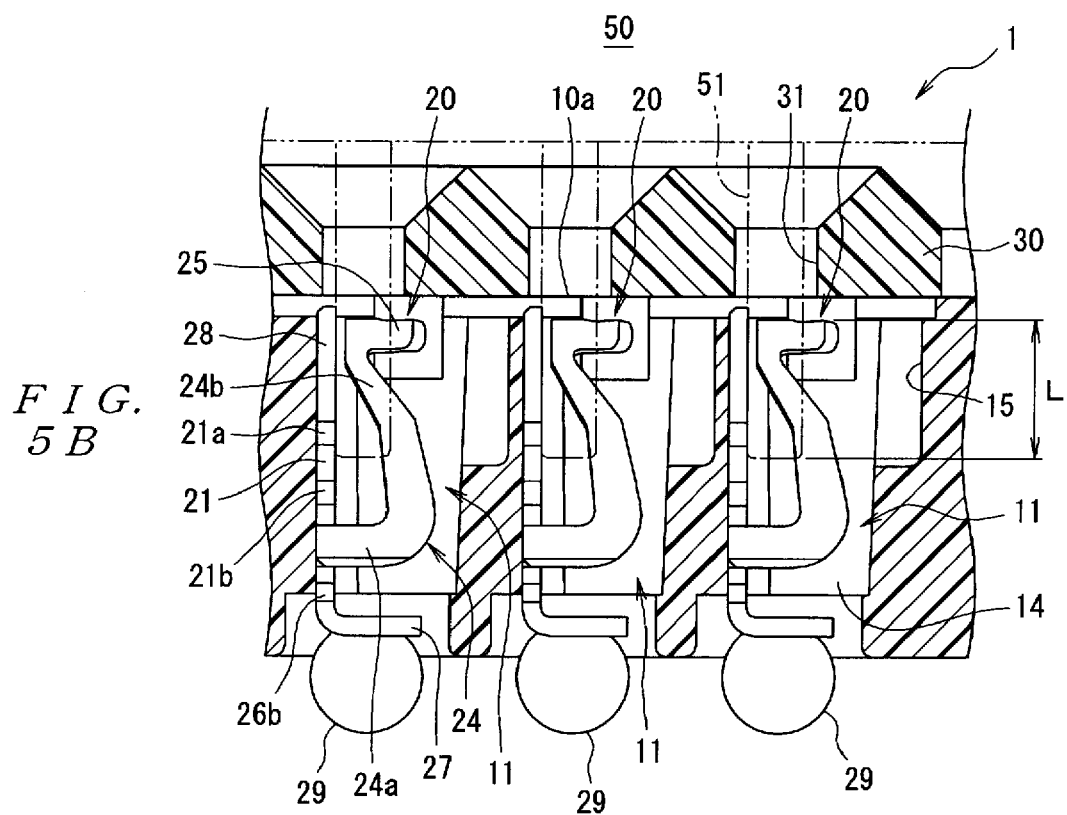

An embodiment of the present invention will be described below with reference to the figures. FIG. 1 is a plan view of an embodiment of the PGA IC socket of the present invention. FIG. 2 is a front view of the PGA IC socket shown in FIG. 1. FIG. 3 is a plan view of the PGA IC socket in a state in which the slide cover is removed. FIG. 4 is a sectional view along line 4-4 in FIG. 3. FIGS. 5A and 5B are the sectional view of the PGA IC socket cut along line 5-5 in FIG. 3; FIG. 5A shows a state in which the slide cover is located in the initial position, and FIG. 5B shows a state in which the slide cover is located in the final position.

The PGA IC socket (hereinafter referred to simply as a "socket") 1 shown in FIGS. 1 and 2 is a socket to which a PGA IC package 50 (see FIGS. 5A and 5B) serving as an electronic component is attached. The socket 1 includes a housing 10, numerous socket contacts 20 (see FIG. 3) attached to the housing 10, a slide cover 30 that moves over the housing 10, and a lever 40 for moving the slide cover 30. The slide cover 30 and lever 40 constitute the "driving part" referred to in Claim 4.

The housing 10 is formed in a substantially rectangular thin plate form by molding an insulating resin, and numerous contact cavities 11 that respectively accommodate the socket contacts 20 arranged in a two-dimensional array, as shown in FIG. 3. Furthermore, the housing 10 is provided with a plurality of holding projections 12 and 13 that hold the pivoting shaft 41 of the lever 40 in a pivotable manner. As is shown in FIGS. 4, 5A and 5B, each of the contact cavities 11 includes a plurality of long rectangular holes 14 that pass through the housing 10 in the vertical direction and a lead pin receiving part 15 that is provided toward the upper surface 10a of the housing 10. The plurality of socket contacts 20 are respectively fastened in the plurality of long rectangular holes 14, with all of these socket contacts facing the same direction. The lead pin receiving parts 15 that open on the upper surface 10a of the housing 10 respectively matches with the long rectangular holes 14. Additionally, the lead pin receiving parts 15 are respectively positioned to the rear of the plurality of long rectangular holes 14, and formed with a substantially semi-circular cutout as seen from the direction of the upper surface as shown in FIGS. 3, 5A and 5B. The depth of the lead pin receiving parts 15 are approximately a half of the thickness of the housing 10.

The slide cover 30 is formed in a substantially rectangular thin plate form by molding an insulating resin, and numerous receiving passageways 31 that are arranged in positions corresponding to the contact cavities 11 provided in the housing 10 are formed in this slide cover 30. A plurality of long holes 33 are formed in each of the two side walls 32 of the slide cover 30 (see FIG. 1), and these long holes 33 are respectively engaged with projections (not shown in the figures) provided on the housing 10. A PGA IC package 50, serving as an electronic component, is carried on the slide cover 30. The carried PGA IC package 50 is detachable from the socket 1. When the PGA IC package 50 is placed on the slide cover 30, numerous lead pins 51 provided on the undersurface of the PGA IC package 50 are respectively inserted into the receiving passageways 31 in the downward direction (direction of arrow D in FIGS. 2, 5A and 5B). Furthermore, the respective lead pins 51 are inserted into the corresponding contact cavities 11 of the housing 10. Moreover, when the PGA IC package 50 is detached from the surface of the slide cover 30, the lead pins 51 are removed in the upward direction (direction of arrow U in FIGS. 2, 5A and 5B) from the contact cavities 11 and then from the receiving passageways 31. Here, the direction of insertion and removal of the lead pins 51 is the vertical direction (in the direction of arrow Z in FIGS. 2, 5A and 5B).

The lever 40 is a substantially L-shaped member, which is formed by bending a metal rod. One side of the lever 40 constitutes a pivoting shaft 41, being held between the holding projections 12, 13 of the housing 10, while the other side is held in a manned to be raised and lowered freely with respect to the housing 10. The tip end on the second side of the lever 40 constitutes an operating part 42. A crank that is coupled to the slide cover 30 is formed on the pivoting shaft 41 of the lever 40, and as a result of the lever 40 being raised and lowered, the slide cover 30 moves in the forward-backward direction (in the direction of arrow X in FIGS. 1, 5A and 5B). Pushing down the lever 40 causes the slide cover 30 to move forward (in the direction of arrow F in FIGS. 1, 5A and 5B) from the initial position, and lifting up the lever 40 causes the slide cover 30 to move backward (in the direction of arrow B in FIGS. 1, 5A and 5B) from the final position.

Figure 6A:
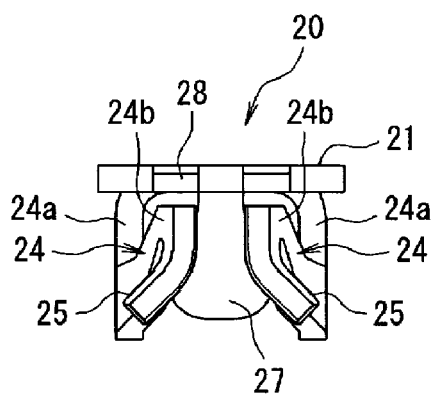
FIGS. 6A through 6E show the socket contact, with FIG. 6A being a plan view, FIG. 6B being a front view, FIG. 6C being a right side view, FIG. 6D being a rear view, and FIG. 6E being a bottom view.
Figures 6B, 6C, 6D:
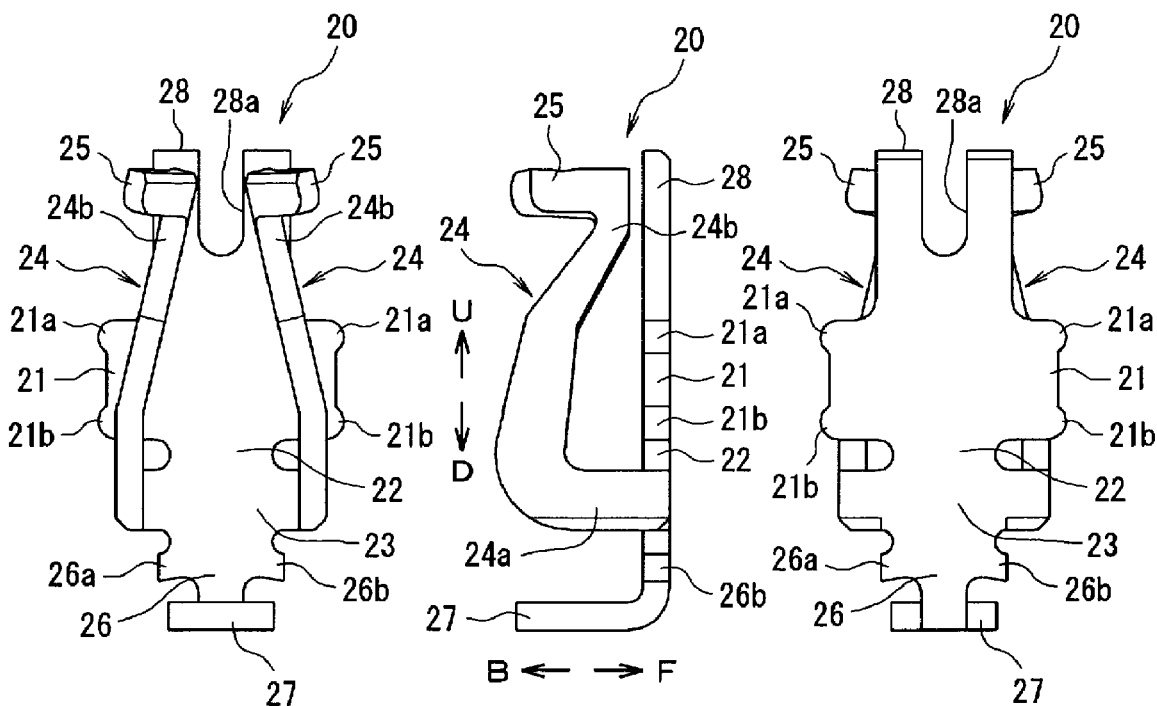
Figure 6E:
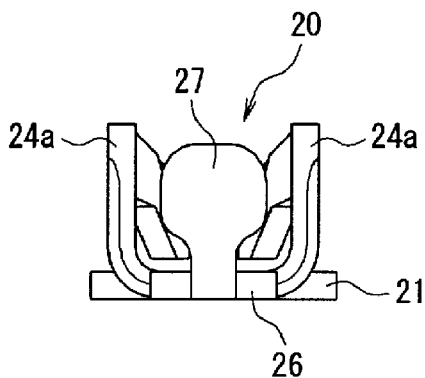

FIGS. 6A through 6E show the socket contact; FIG. 6A is a plan view, FIG. 6B is a front view, FIG. 6C is a right side view, FIG. 6D is a back view, and FIG. 6E is a bottom view. FIGS. 6A through 6E also show the arrows B, F, U, and D that indicate the orientations of the socket contact in a state in which this socket contact is accommodated in the housing 10.

Each socket contact 20 is formed by stamping and forming a metal plate, and these socket contacts 20 are respectively fastened in the plurality of long rectangular holes 14 of the contact cavities 11 provided in the housing 10. Each socket contact 20 includes a retention section 21 that is press-fit into the plurality of long rectangular holes 14 of the corresponding contact cavity 11, a base section 23 that extends below the retention section 21, and a pair of resilient contact pieces 24 that extend from either side edge of the retention section 21 in directions facing each other.

The retention section 21 is formed in a substantially rectangular plate form that is long in the direction of width (left-right direction in FIG. 6B), and having upper engaging projections 21a and lower engaging projections 21b that are press-fit in the side walls of the corresponding rectangular holes 14. Each of the projections 21a, 21b are provided on both side edges of the retention section 21.

The base section 23 extends downward from the retention section 21 through a narrowed section 22, and is formed in a substantially rectangular shape that is long in the direction of width.

The paired resilient contact pieces 24 respectively include end sections 24a that extend backward (in the direction of arrow B in FIG. 6C) from the side edges of the base section 23, and lead pin contact sections 24b that extend upward (in the direction of arrow U in FIG. 6C) and forward (in the direction of arrow F in FIG. 6C) at an inclination from the rear ends of the end sections 24a and that are also formed with an inclination so as to approach each other toward the tip ends thereof. Furthermore, lead pin guide pieces 25 are respectively provided at the tip ends of the lead pin contact sections 24b, with these lead pin guide pieces 25 extending backward at an inclination so as to spread from each other from the tip ends of the lead pin contact sections 24b toward the tip of these lead pin guide pieces 25.

Moreover, a foot 27 is provided at the lower edge of the base section 23 through a linking section 26. The foot 27 is formed by bending each socket contact backward from the lower end of the linking section 26. A solder ball 29 (see FIGS. 5A and 5B) is formed on the undersurface of the foot 27. The solder ball 29 is connected by soldering to the surface of a circuit board PCB (see FIG. 2). In addition, a pair of linking pieces 26a and 26b that are linked to a carrier C2 (see FIGS. 7, 8A and 8B) in an integral manner during the manufacturing process of each socket contact 20 are formed at either side edge of the linking section 26.

Furthermore, an excessive displacement prevention section 28 that prevents the pair of resilient contact pieces 24 from being excessive displaced is provided at the upper edge of the retention section 21. The excessive displacement prevention section 28 extends upward from the upper edge of the retention section 21 with a width smaller than the width of the retention section 21, and a cutout 28a is formed in the central portion in the direction of width. The upper end of the excessive displacement prevention section 28 is linked to a carrier C1 during the manufacturing process of each socket contact 20 (see FIGS. 7 through 9). The front surfaces of the excessive displacement prevention section 28, retention section 21, narrowed section 22, base section 23, and linking section 26 are formed in order to be coplanar.

Figure 7:
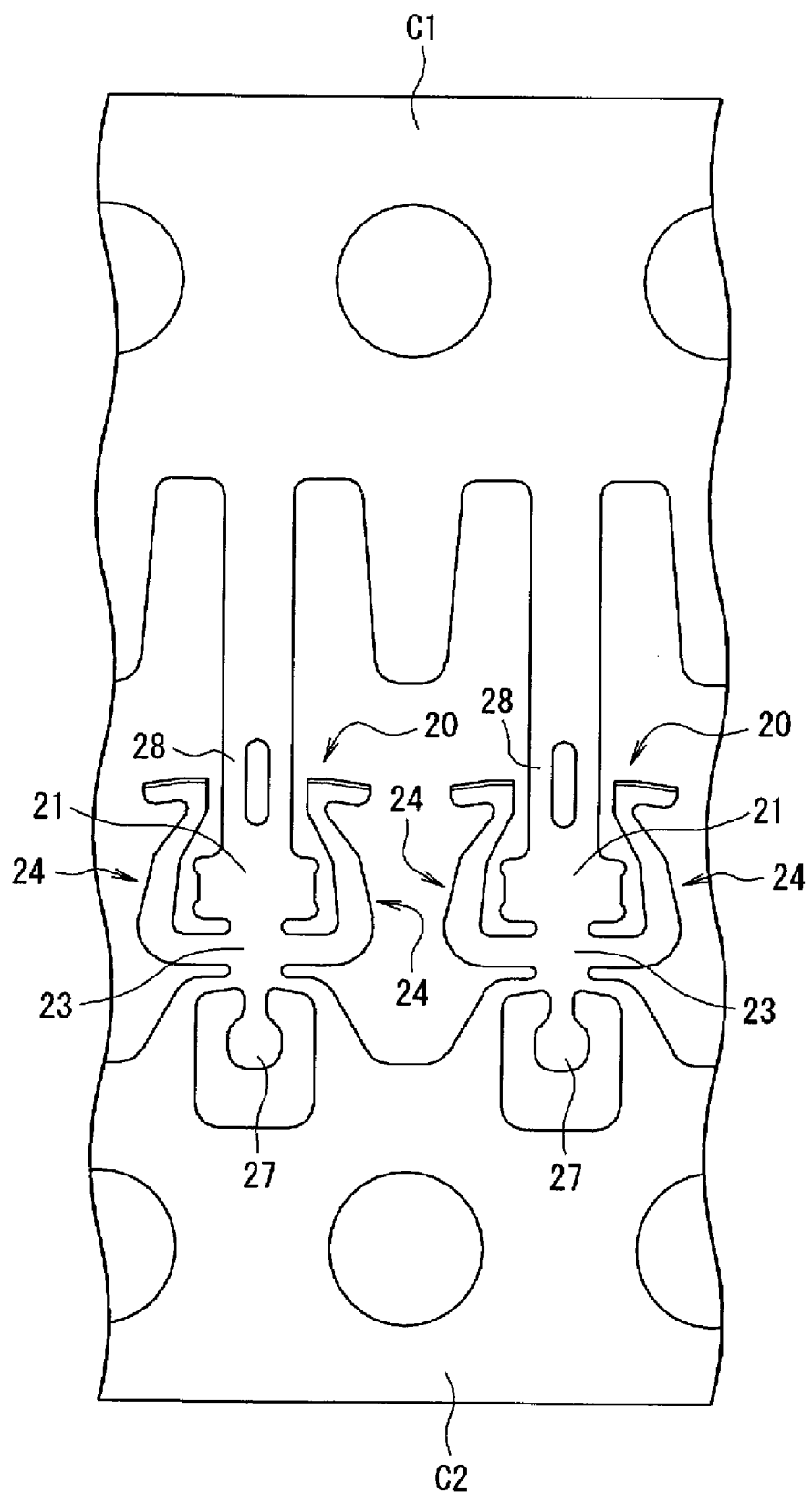
FIG. 7 is a diagram showing a state in which a metal plate is stamped in the manufacture of the socket contacts such as that shown in FIGS. 6A through 6E.
Figure 9A:
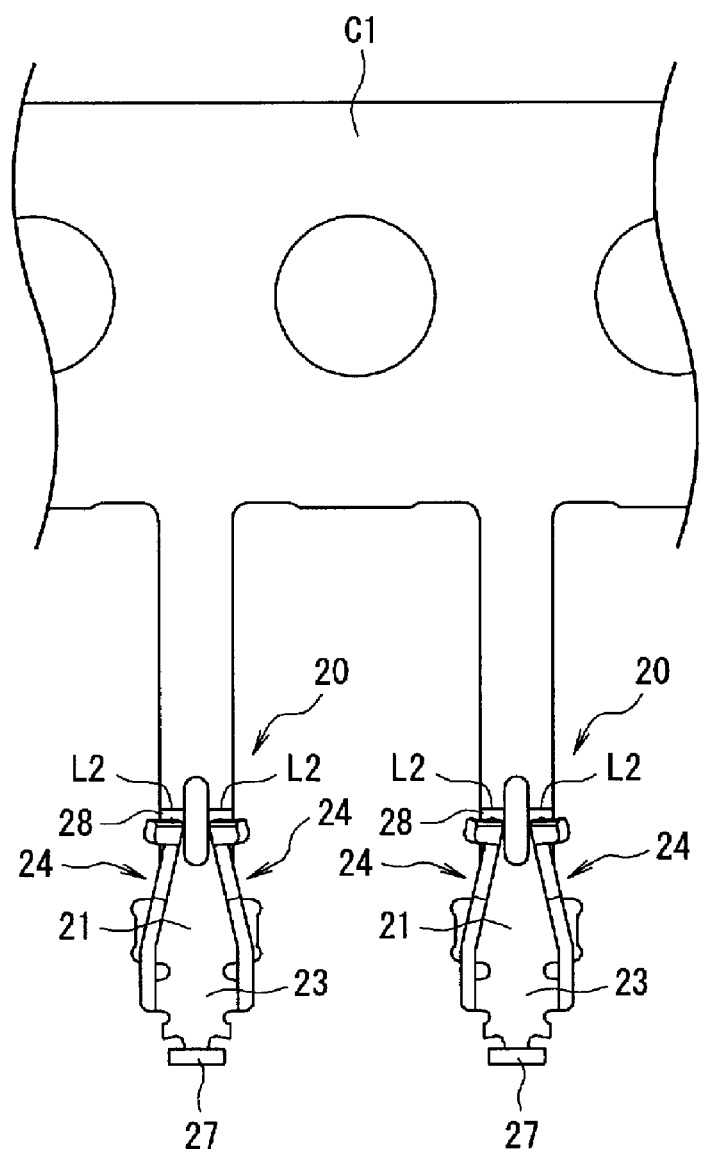
FIG. 9 is a diagram showing a state in which one of the carriers is cut off from the state shown in FIGS. 8A and 8B, with FIG. 9A being a front view corresponding to FIG. 6B, and FIG. 9B being a right side view corresponding to FIG. 6C.
Figure 9B:
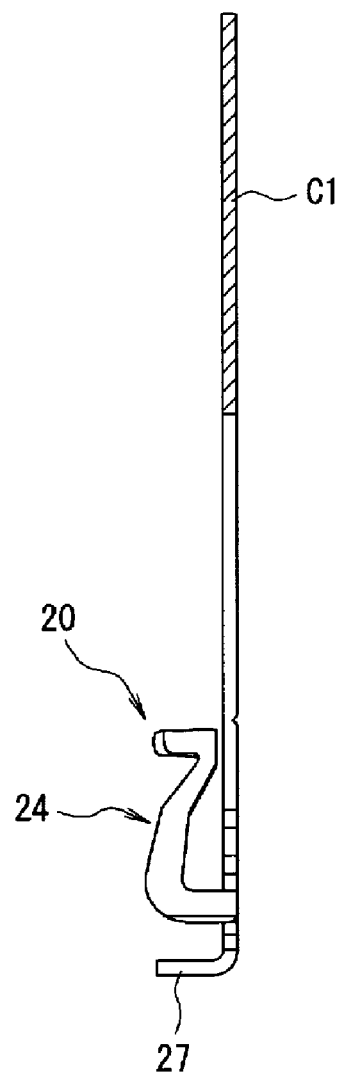

FIG. 7 is a diagram showing a state in which a metal plate is stamped in the manufacture of the socket contacts 20, such as that shown in FIGS. 6A through 6E. FIGS. 8A and 8B are illustrations showing a state in which bending work is performed from the stamped state of the metal plate shown in FIG. 7; FIG. 8A is a front view corresponding to FIG. 6B, and FIG. 8B is a right side view corresponding to FIG. 6C. FIG. 9 is a diagram showing a state in which one of the carriers is cut off from the state shown in FIGS. 8A and 8B; FIG. 9A is a front view corresponding to FIG. 6B, and FIG. 9B is a right side view corresponding to FIG. 6C.

During manufacturing, the socket contacts 20 are first formed integrally with the carriers C1 and C2 by stamping a metal plate as shown in FIG. 7. Next, bending work is performed to form the pairs of resilient contact pieces 24 and foot 27, as shown in FIGS. 8A and 8B. Then, the linking pieces 26a and 26b of the socket contacts 20 are cut along the cutlines L1 in order to cut off the carrier C2, as shown in FIG. 9. In the state shown, the socket contacts 20 are linked to the carrier C1 at the upper ends of the excessive displacement prevention sections 28.

The individual socket contacts 20 that are linked to the carrier C1 are respectively accommodated inside the contact cavities 11 from above the housing 10 in the downward direction with the foot 27 at the bottom. At this point, as is shown in FIG. 4, the upper engaging projections 21a and lower engaging projections 21b of the retention section 21 are press-fit in the side walls of the plurality of long rectangular holes 14 of the corresponding contact cavities 11 such that the front surfaces of the excessive displacement prevention sections 28, retention section 21, narrowed sections 22, base sections 23, and linking sections 26 respectively follow along the front wall surfaces of the plurality of long rectangular holes 14. As a result, the lead pin receiving parts 15 of the contact cavities 11 are respectively positioned toward the rear ends of the end sections 24a of the socket contacts 20.

Subsequently, the socket contacts 20 are cut along the cutlines L2 shown in FIG. 9 to remove the carrier C1.

The slide cover 30 to which the lever 40 is attached is attached to the upper surface 10a of the housing 10 in which the socket contacts 20 are fastened, and this completes the socket 1. Then, the solder balls 29 formed on the undersurfaces of the foot 27 of the socket contacts 20 are connected by soldering to the surface of the circuit board PCB, so that the socket 1 is mounted on this circuit board PCB as shown in FIG. 2.

Figure 10A:
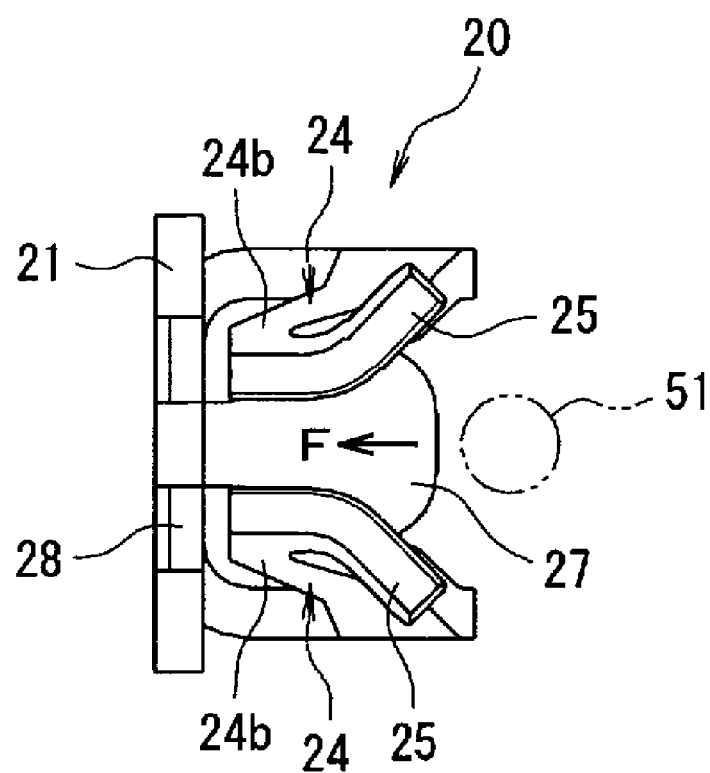
FIGS. 10A and 10B show the relationship between a lead pin and a socket contact, with FIG. 10A being a schematic plan view when the slide cover is in the initial position and before the lead pin contacts the socket contact, and FIG. 10B being a schematic plan view when the slide cover is in the final position, and the lead pin is in contact with the socket contact.
Figure 10B:
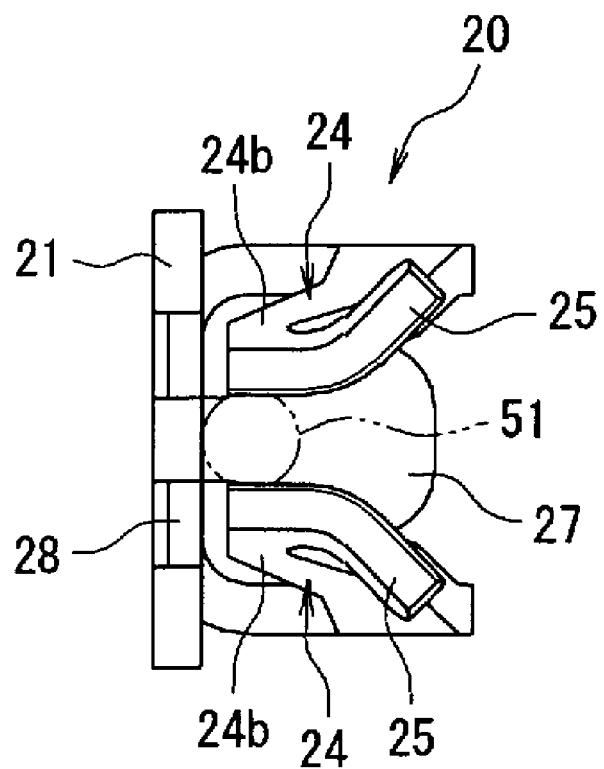
Figure 11A:
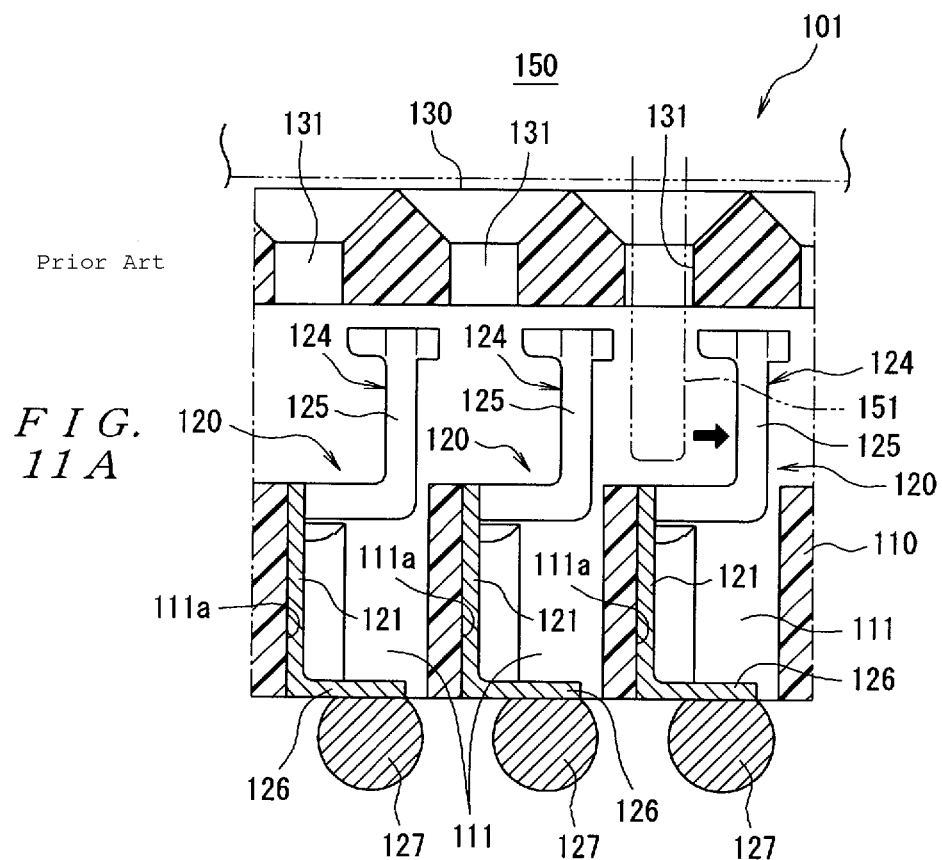
FIGS. 11A and 11B show the conventional PGA IC socket, with FIG. 11A being a sectional view of the PGA IC socket before the slide cover is moved, and FIG. 11B being a sectional view of the PGA IC socket after the slide cover is moved.
Figure 11B:
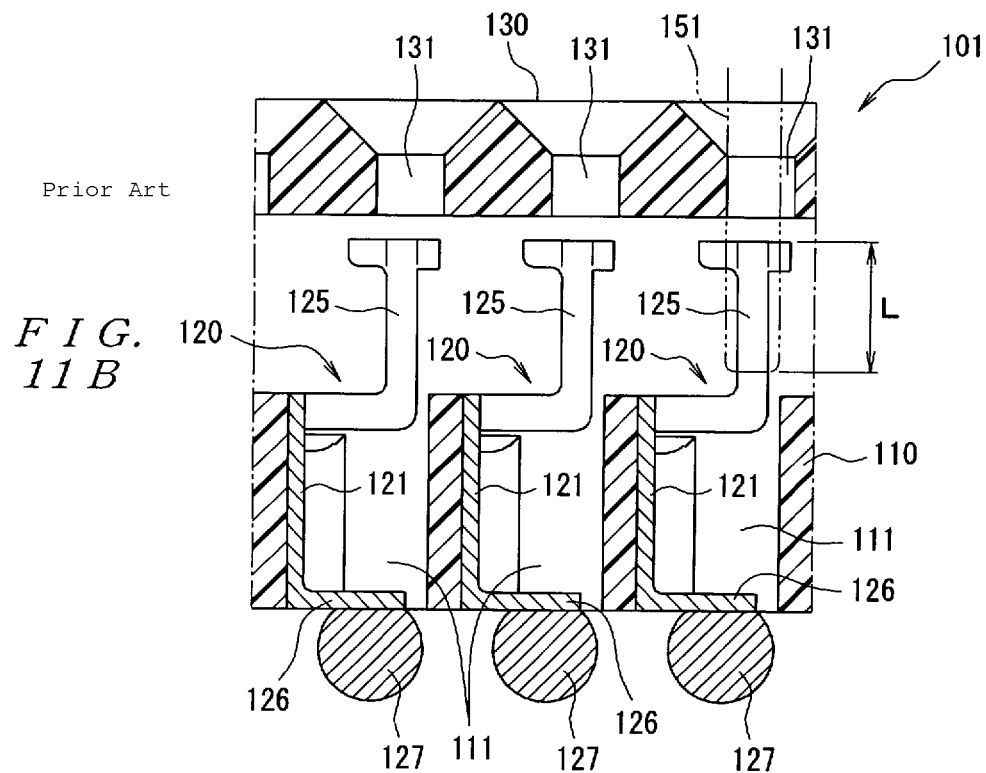
Figure 14:
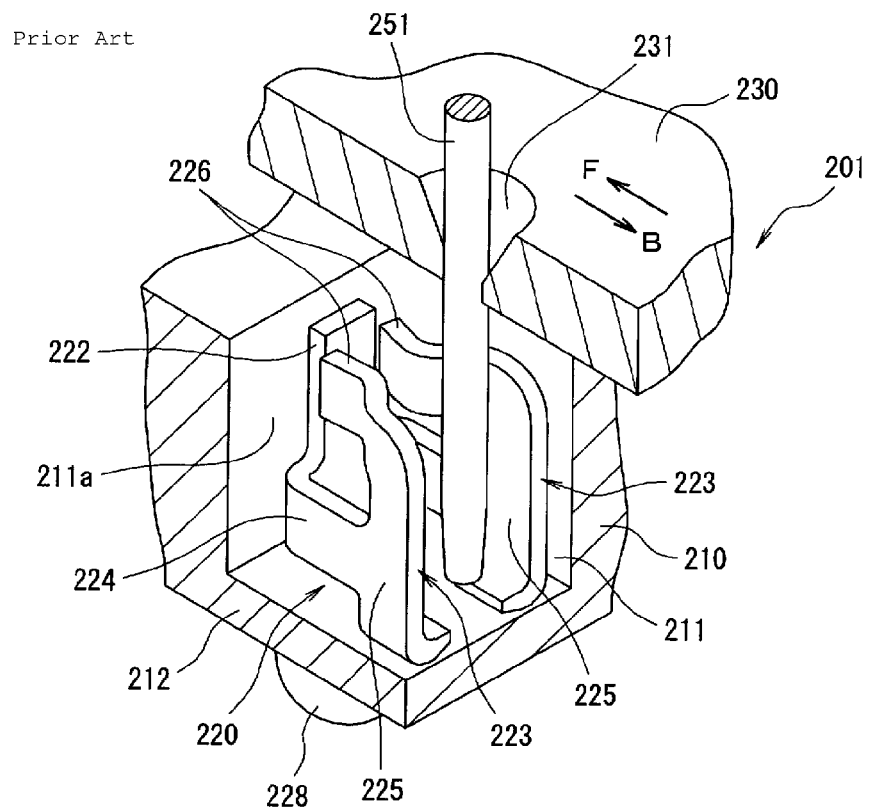
FIG. 14 is an explanatory diagram showing the relationship between a socket contact and a lead pin inside the housing in another example of a conventional PGA IC socket.
Figure 15:
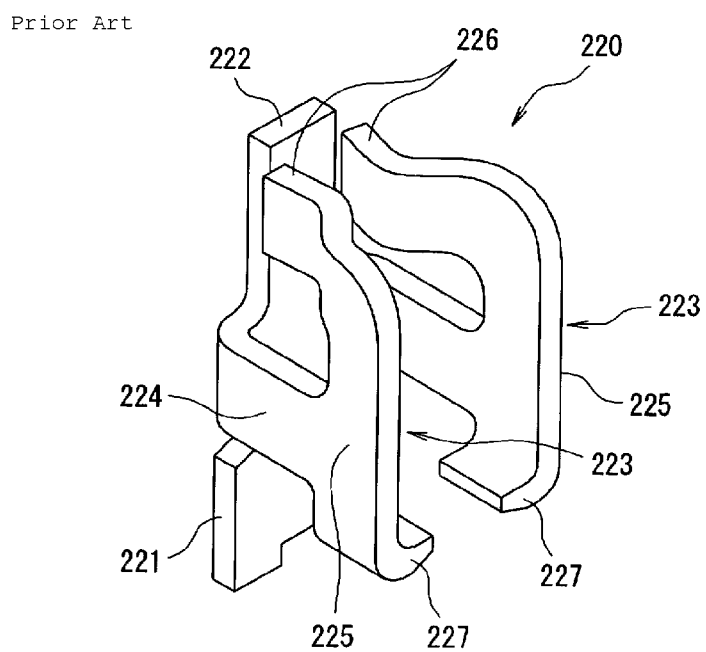
FIG. 15 is a perspective view of a socket contact used in the PGA IC socket shown in FIG. 14.

Next, the state obtained when the IC package 50 is attached to the socket 1 will be described with referenced to FIGS. 5A, 5B, 10A and 10B. FIGS. 10A and 10B show the relationship between a lead pin and a socket contact; FIG. 10A is a schematic plan view when the slide cover is in the initial position and before the lead pin contacts the socket contact, and FIG. 10B is a schematic plan view when the slide cover is in the final position, and the lead pin is in contact with the socket contact.

When the IC package 50 is to be attached to the socket 1, the slide cover 30 is located in the initial position as shown in FIG. 5A. When the IC package 50 is placed on the slide cover 30 in this state, the numerous lead pins 51, provided on the undersurface of the IC package 50, are respectively inserted into the receiving passageways 31 in the downward direction (direction of arrow D in FIG. 5A). In this case, the respective lead pins 51 are positioned inside the lead pin receiving parts 15 of the corresponding contact cavities 11. That is, the respective lead pins 51 are positioned to the rear end side of the end sections 24a of the corresponding socket contacts 20. Therefore, the lead pins 51 are not positioned directly above the retention section 21 when these lead pins 51 are inserted. In this case, the tip ends of the lead pins 51 do not contact the bottom walls of the lead pin receiving parts 15 as shown in FIG. 5A. Furthermore, the lead pins 51 are not in contact with the socket contacts 20 as shown in FIGS. 5A, 5B, 10A and 10B. Accordingly, the IC package 50 is placed on the slide cover 30 with zero insertion force.

Next, as a result of the lever 40 being pushed down, the slide cover 30 moves forward (in the direction of arrow F in FIG. 5A) from the initial position. Then, the IC package 50 moves forward along with the movement of the slide cover 30. Consequently, the lead pins 51 respectively move forward from the lead pin receiving parts 15, and are guided by the lead pin guide pieces 25 of the corresponding socket contacts 20 and held between the lead pin contact sections 24b of the paired resilient contact pieces 24, thus making contact with these lead pin contact sections 24b. In this case, the lead pin guide pieces 25 can reliably guide the lead pins 51 to the lead pin contact sections 24b, thus causing these lead pins 51 to contact the lead pin contact sections 24b. As a result, the IC package 50 and the circuit board PCB are electrically connected. Then, when the slide cover 30 is in the final position, the lead pins 51 are caused to strike against the excessive displacement prevention sections 28 of the corresponding socket contacts 20, thus performing the positioning of these lead pins 51 as shown in FIGS. 5B and 10B. The state of contact between the lead pins 51 and the lead pin contact sections 24b is maintained from the time when the lead pins 51 contact the lead pin contact sections 24b until these lead pins 51 are caused to strike against the excessive displacement prevention sections 28, so that the lead pins 51 are in contact with the lead pin contact sections 24b in positions to the rear of the retention section 21. Therefore, the lead pins 51 are not positioned directly above the retention section 21 when contacting the lead pin contact sections 24b. Because the lead pins 51 are not positioned directly above the retention section 21, when inserted into the lead pin receiving parts 15 and thus contacting the lead pin contact sections 24b, the height of the PGA IC socket 1 can be reduced without reducing the effective mating length L. The effective mating length L is the length from the tip end of each lead pin 51 to the upper end of the corresponding resilient contact pieces 24.

Furthermore, when the lead pins 51 move forward so as to contact the lead pin contact sections 24b of the paired resilient contact pieces 24 by being held between these lead pin contact sections 24b, the lead pin contact sections 24b also move forward along with the movement of the lead pins 51. In this case, it would also be conceivable that the lead pin contact sections 24b move forward further than necessary such that the respective resilient contact pieces 24 are displaced excessively. However, in such a case, the lead pin contact sections 24b strike against the excessive displacement prevention sections 28, so that the excessive displacement of the resilient contact pieces 24 can be prevented.

Moreover, the resilient contact pieces 24 in each pair extend in directions facing each other from both side edges of the base section 23 which extends downward from the retention section 21 that is fastened in the plurality of long rectangular holes 14 of the corresponding contact cavity 11. In addition, the paired resilient contact pieces 24 respectively comprise end sections 24a that extend backward from the side edges of the base section 23, and lead pin contact sections 24b that extend upward and forward at an inclination from the rear ends of the end sections 24a and that are also formed with an inclination so as to approach each other toward the tip ends thereof. Therefore, each of the paired resilient contact pieces 24 is formed substantially in the shape of the letter Z that extends from below the retention section 21, so that the spring length can be increased compared to the case in which the pair of resilient contact pieces 24 extend from the upper edge of the retention section 21 that is fastened to the contact cavity 11.

Furthermore, because the retention section 21 of the socket contacts 20 are respectively positioned above the base section 23 from which the resilient contact pieces 24 extend, the retention section 21 can be press-fit in the plurality of long rectangular holes 14 of the corresponding contact cavities 11 in the vicinity of the central portion of the housing 10 in the vertical direction (thickness direction) as shown in FIG. 4. When the retention section 21 of the socket contacts 20 are press-fit in the vicinity of the central portion of the housing 10 in the vertical direction, only the vicinity of the central portion in the vertical direction of the housing 10 is deformed, so that there is no deformation on the lower side or upper side. Accordingly, even in cases where numerous socket contacts 20 are press-fit in the housing 10, the upward warping of the housing 10 with respect to the circuit board PCB as shown in FIG. 13 and the downward warping of the housing 10 with respect to the circuit board PCB can be suppressed to the maximum extent possible.

Note that if the lever 40 is lifted up when the slide cover 30 is in the final position, the slide cover 30 moves backward (in the direction of arrow B in FIG. 5A) from the final position, and is placed in the initial position shown in FIG. 5A. Then, accompanying the movement of the slide cover 30, the IC package 50 moves backward. This releases the state of the lead pins 51 being held between the paired resilient contact pieces 24, so that the slide cover 30 can be detached in the upward direction (direction of arrow U in FIG. 5A).

An embodiment of the present invention has been described above. However, the present invention is not limited to this embodiment, and various alterations and modifications are possible.

For example, it is not absolutely necessary to provide each socket contact 20 with an excessive displacement prevention section 28 and lead pin guide pieces 25.

What is claimed is:

1. A socket contact that makes contact with a lead pin provided on a mating electronic component, wherein
the socket contact comprises a retention section having a pair of engaging projections on each side edge of the retention section that are press-fit in a contact cavity provided in a housing, a base section that extends downward from the retention section, and a pair of resilient contact pieces that extend from both side edges of the base section in directions facing each other and positioned under the pair of engaging projections, and an excessive displacement prevention section extending upward from an upper edge of the retention section,
the pair of resilient contact pieces respectively comprise end sections that extend parallel to each other and away from the side edges of the base section, and lead pin contact sections that extend upward and forward at an angle from ends of the end sections and that are also formed with an inclination so as to approach each other toward tip ends thereof,
wherein after the lead pin is inserted into the contact cavity, the lead pin moves toward the retention section, so as to contact the lead pin contact sections in a position to a rear side of the retention section facing the end sections of the paired resilient contact pieces.

2. The socket contact according to claim 1, wherein the lead pin contact sections strike against the excessive displacement prevention section when the lead pins contact the lead pin contact sections in positions to the rear side of the retention section so as to prevent the pair of resilient contact pieces from being excessively displaced.

3. The socket contact according to claim 1, wherein the excessive displacement prevention section has a width smaller than the width of the retention section.

4. The socket contact according to claim 1, wherein the excessive displacement prevention section includes a cutout formed in a central portion of the excessive displacement prevention section in the direction of width.

5. The socket contact according to claim 1, further comprising a lead pin guide piece provided at the tip end of each of the lead pin contact section.

6. The socket contact according to claim 5, wherein the lead pin guide piece guides the lead pin when the lead pin moves.

7. The socket contact according to claim 1, wherein the retention section is a substantially rectangular plate-form retention section.

8. The socket contact according to claim 1, wherein the retention section is press-fittable into a plurality of long rectangular holes of the corresponding contact cavity.

9. The socket contact according to claim 8, wherein the engaging projections include upper engaging projections and lower engaging projections being press-fittable in side walls of the corresponding rectangular holes and provided on both side edges of the retention section.

10. The socket contact according to claim 1, wherein the base section is a substantially rectangular plate-form base section.

11. The socket contact according to claim 1, further comprising a foot provided at the lower edge of the base section through a linking section.

12. The socket contact according to claim 11, wherein the foot is formed by bending each socket contact backward from the lower end of the linking section.

13. The socket contact according to claim 11, further comprising a solder ball formed on the undersurface of the foot.

14. The socket contact according to claim 1, wherein the engaging projections are located in a center area in the vertical direction between the base section and the excessive displacement prevention section.

15. A PGA IC socket comprising:
   socket contacts that respectively contact a lead pin provided on a mating electronic component;
   a housing in which contact cavities are arranged in a two-dimensional array, with the contact cavities respectively accommodating the socket contacts oriented in a same direction as each other such that the lead pin is insertable into and removeable from the contact cavities; and
   a slide cover and a lever that cause the lead pin to move in the forward-backward direction which is orthogonal to the direction of insertion and removal of the lead pin,
   wherein each socket contact comprises:
   a retention section having a pair of engaging projections on each side edge of the retention sections that are press-fit in a contact cavity provided in a housing, a base section that extends downward from this retention section, and a pair of resilient contact pieces that extend from both side edges of the base section in directions facing each other and positioned under the pair of engaging retention sections, and an excessive displacement prevention section extending upward from an upper edge of the retention section, and
   the paired resilient contact pieces respectively comprise end sections that extend parallel to each other and away from the side edges of the base section, and lead pin contact sections that extend upward and forward at an angle from the rear ends of the end sections and that are also formed with an inclination so as to approach each other toward tip ends thereof,
   wherein after the lead pin is inserted into the contact cavity the lead pin moves toward the rear ends of the end sections the retention sections, the lead pin moves forward so as to contact the lead pin contact sections in a position to a rear side of the retention section facing the end sections of the paired resilient contact pieces,
   wherein after the lead pin is inserted into the contact cavity toward the rear ends of the end sections, the lead pin moves forward so as to contact the lead pin contact sections in a position to a rear side of the retention section facing the end sections of the paired resilient contact pieces.

16. The PGA IC socket according to claim 15, wherein the lead pin contact sections strike against the excessive displacement prevention section when the lead pins contact the lead pin contact sections in positions to the rear side of the retention section so as to prevent the pair of resilient contact pieces from being excessively displaced.

17. The PGA IC socket contact according to claim 15, wherein the excessive displacement prevention section has a width smaller than the width of the retention section.

18. The PGA IC socket according to claim 15, wherein the excessive displacement prevention section includes a cutout formed in a central portion of the excessive displacement prevention section in the direction of width.

19. The PGA IC socket according to claim 15, further comprising a lead pin guide piece provided at the tip end of each of the lead pin contact section.

20. The PGA IC socket according to claim 19, wherein the lead pin guide piece guides the lead pin when the lead pin moves.

21. The PGA IC socket according to claim 15, wherein the retention section is a substantially rectangular plate-form retention section.

22. The PGA IC socket according to claim 15, wherein the retention section is press-fittable into a plurality of long rectangular holes of the corresponding contact cavity.

23. The PGA IC socket according to claim 22, wherein the engaging projections include upper engaging projections and the lower engaging projections being press-fittable in side walls of the corresponding rectangular holes and provided on both side edges of the retention section.

24. The PGA IC socket according to claim 15, wherein the base section is a substantially rectangular plate-form base section.

25. The PGA IC socket according to claim 15, further comprising a foot provided at the lower edge of the base section through a linking section.

26. The PGA IC socket according to claim 25, wherein the foot is formed by bending each socket contact backward from the lower end of the linking section.

27. The PGA IC socket according to claim 25, further comprising a solder ball formed on the undersurface of the foot.

28. The PGA IC socket according to claim 15, wherein the engaging projections are located in a center area in the vertical direction between the base section and the excessive displacement prevention section.

* * * * *

UNITED STATES PATENT AND TRADEMARK OFFICE
CERTIFICATE OF CORRECTION

PATENT NO. : 8,152,553 B2
APPLICATION NO. : 12/389547
DATED : April 10, 2012
INVENTOR(S) : Hidenori Taguchi et al.

Page 1 of 1

It is certified that error appears in the above-identified patent and that said Letters Patent is hereby corrected as shown below:

In column 12, line 2 "rear" should be deleted;

In column 12, line 6 "the rear ends of the end sections" should be deleted;

In column 12, line 7 "the lead pin moves forward" should be deleted.

Signed and Sealed this
First Day of January, 2013

David J. Kappos
*Director of the United States Patent and Trademark Office*